United States Patent [19]

Wasilko

[11] 4,003,655
[45] Jan. 18, 1977

[54] HYBRID SILICON AVALANCHE QUADRANT DETECTOR

[75] Inventor: Robert Wasilko, Belmar, N.J.

[73] Assignee: The United States of America as represented by the Secretary of the Army, Washington, D.C.

[22] Filed: Apr. 17, 1975

[21] Appl. No.: 569,045

[52] U.S. Cl. .................. 356/4; 244/3.16; 250/203 R; 250/578; 356/5; 356/152

[51] Int. Cl.² ............. G01C 3/08; G01J 1/20

[58] Field of Search ........... 356/4, 5, 152; 350/201, 350/16; 250/203 R, 578, 239; 244/3.16

[56] References Cited

UNITED STATES PATENTS

| | | | |
|---|---|---|---|
| 2,942,117 | 6/1960 | Maxwell, Jr. et al. | 250/203 R |
| 3,348,058 | 10/1967 | Falbel | 250/203 R |
| 3,634,689 | 1/1972 | Ejiri et al. | 250/204 |
| 3,802,780 | 4/1974 | Helm et al. | 356/152 |
| 3,845,276 | 10/1974 | Kendy et al. | 356/5 |
| 3,899,145 | 8/1975 | Stephenson | 244/3.16 |

OTHER PUBLICATIONS

Skolnik, Radar Handbook, 1970, pp. 37–43,43.
Ammon et al., Applied Optics, vol. 9, No. 10, pp. 2256–2260.

Primary Examiner—Maynard R. Wilbur
Assistant Examiner—S. C. Buczinski
Attorney, Agent, or Firm—Nathan Edelberg; Sheldon Kanars; Daniel D. Sharp

[57] ABSTRACT

A method and apparatus for retrofitting an airborne laser tracker with a laser ranging capability is described. A silicon avalanche detector is mounted within the silicon quadrant receiver of a laser tracker for an aircraft. The silicon avalanche detector is mounted behind the metalized quadrant electrodes of the quadrant detector in a position which permits the avalanche detector to receive radiation passing between the quadrant electrodes. An increased instrument sensitivity is achieved which provides an increased ranging capability for the airborne laser tracker.

7 Claims, 5 Drawing Figures

HYBRID SILICON AVALANCHE QUADRANT DETECTOR

RIGHTS OF GOVERNMENT

The invention described herein may be manufactured and used by or for the Government for governmental purposes without the payment of any royalties thereon or therefor.

BACKGROUND OF INVENTION

1. Field of Invention

The present invention relates to the receiver portion of a laser target designator system. More specifically, the present invention relates to an airborne laser tracker system and means for retrofitting the laser trucker with a ranging capability.

2. Description of Prior Art

Laser target designator systems are known in the art and are designed to search, acquire, track, and display to pilots targets being designated by a laser. The receiver portion of such a system is known as an airborne laser tracker which is commonly referred to as an ALT.

Known types of airborne laser trackers typically have a maximum range of 2–3 km with a 3km visibility. This range is not adequate under some circumstances for providing a ranging function. A range of 11km with a 11km visibility is desirable in order for the ALT to function as a rangefinder.

SUMMARY OF INVENTION

Accordingly, it is a primary object of the present invention to provide an airborne laser tracker with a ranging capability.

It is another object of the present invention to provide an airborne laser tracker with a ranging means, which can be retrofitted into a known ALT with a minimum disturbance to the tracking function and the associated equipment.

It is a further object of the present invention to provide a ranging function to a known ALT with a detector means which utilizes the existing optical system of the ALT, thereby eliminating redundancy and retaining ease of maintaining boresight with the laser tracker line of sight.

The objects of the present invention are fulfilled by adding to a known ALT (airborne laser tracker) an additional radiation detector which increases the overall receiver sensitivity and extends the range of the ALT from 2–3 km with a 3 km visibility to 11 km with a 11 km visibility.

The ALT receiver for use with the present invention can be installed in the nose of an aircraft. The receiver assembly comprises a two axis rate gyro stabilized platform containing the radiation detector optics, the radiation detector, and the electronics necessary to receive and process the laser signals. The optics and detector are mounted on suitable gimbal components to give the device a tracking capability.

The detector of the ALT used with the present invention is a quadrant detector including four equally spaced quadrant electrodes. Each of the electrodes is connected to suitable signal processing means for performing control functions.

The present invention resides in part in the discovery that a substantial amount of radiation received in the ALT passes through the spaces between the quadrant electrodes without being detected. The present invention makes use of this otherwise wasted radiation by placing a silicon avalanche detector behind the quadrant detector in such a position that it receives and detects the radiation transmitted between the quadrant electrodes.

In this manner the sensitivity of the receiver is increased, thus providing the receiver with an increased range. Accordingly, the ALT is provided with a ranging capability.

The same optics provided for the quadrant detector are utilized for the additional silicon avalanche detector. Therefore, the size and configuration of the ALT remains substantially unchanged.

BRIEF DESCRIPTION OF DRAWINGS

The objects of the present invention and the attendant advantages thereof will become more readily apparent by reference to the following drawings wherein.

DETAILED DESCRIPTION OF THE DRAWINGS

Figure 1:
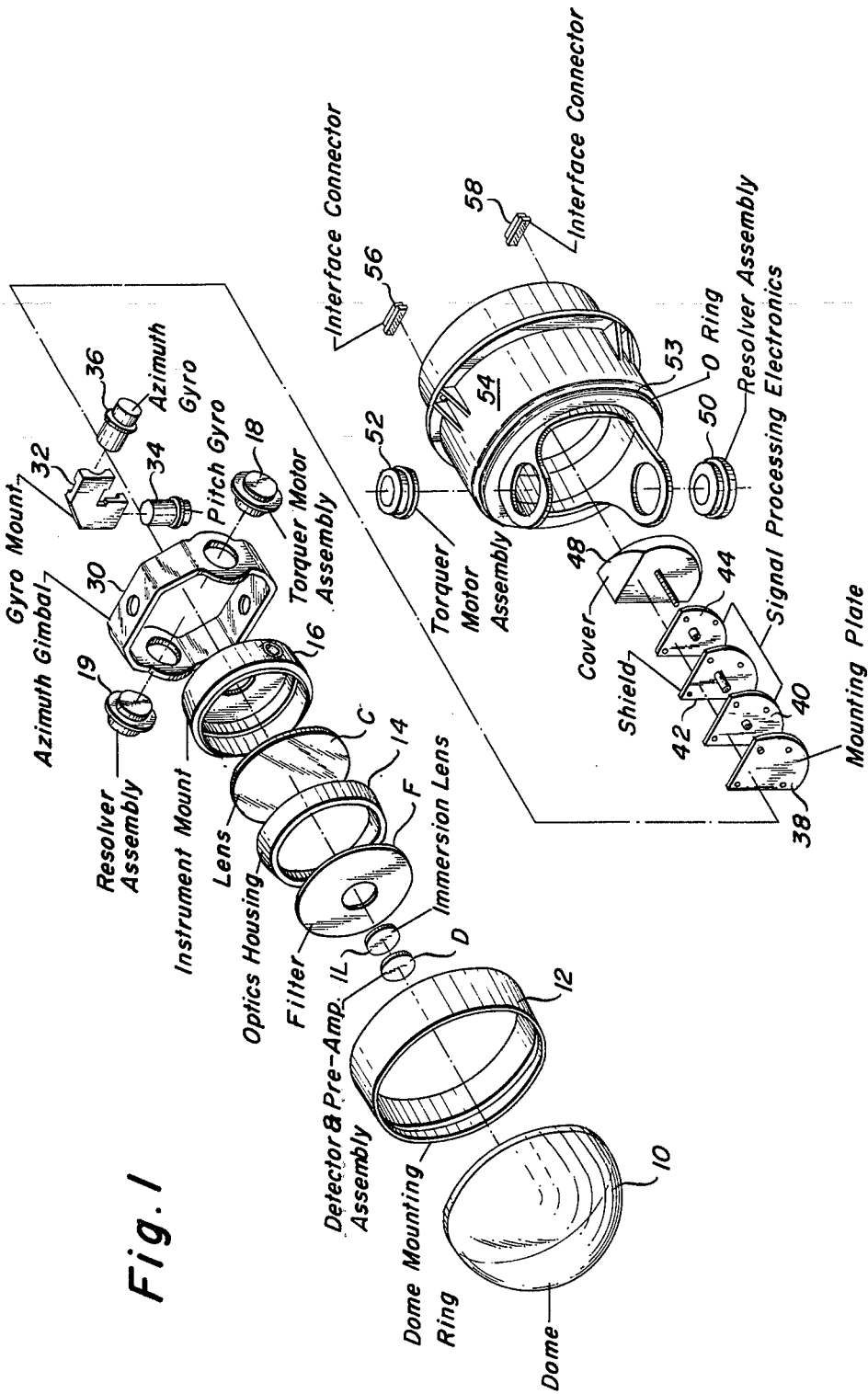
FIG. 1 is an exploded view illustrating the components and assembly of the airborne laser tracker used with the present invention.

Referring in detail to FIG. 1 there is illustrated an airborne laser tracker for use with the present invention. The entire assembly of FIG. 1 is adapted for mounting in the nose of an aircraft.

The assembly of FIG. 1 includes a transparent dome 10 through which radiation emitted from a target is transmitted into the tracker assembly. The dome has a transmittance of approximately 88 percent in a preferred embodiment. The dome 10 is hermetically coupled to a dome mounting ring 12. Ring 12 is sealed to outer gimbal support 54 by an O-ring 53.

As a result the entire assembly of FIG. 1 is a hermetically sealed unit which is purged and filled with dry nitrogen. This prevents the fogging of the dome and optics and protects other internal components from moisture.

Disposed within dome 10 is the optical system of the receiver including optics housing 14, filter F, collector lens C and immersion lens IL. The optical system will be described more fully hereinafter with reference to FIG. 2.

Figure 2:
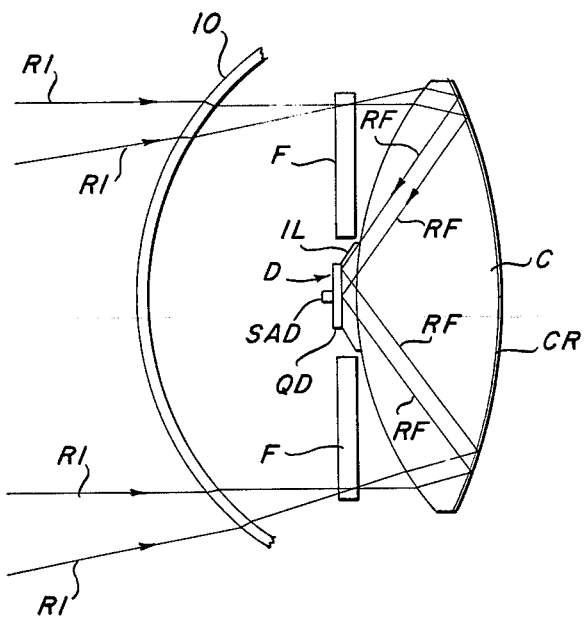
FIG. 2 is a diagrammatic view illustrating the optical system of a laser tracker in combination with the detector of the present invention.

The detector assembly D of the present invention including suitable pre-amplifier means is illustrated in FIG. 1 and as will become more apparent with reference to FIG. 2 is glued to immersion lens IL.

The entire optical system and detector D are disposed within an instrument mount 16 which is mounted for rotation in azimuth gimbal structure 30. Azimuth gimbal 30 is mounted for rotation in outer gimbal support 54. Accordingly, the entire optical system and detector are mounted for rotation in two orthogonal directions to facilitate tracking of a target.

Pancake type d–c torquer motors 18, 52 and resolvers assemblies 19, 50 are located on opposite ends of each respective gimbal axis for rotating the gimbals in accordance with command signals.

At the back of the receiver assembly there is provided a gyro mount 32, pitch gyro 34, and azimuth gyro 36.

A signal processing module is mounted in the rear of the outer elevational gimbal 54 in an aluminum cover 48. Two printed circuit boards 40, 44 are mounted in cover 48 on a mounting plate 38. The circuit boards 40, 44 are separated by a shield 42. Interface connectors 56, 58 are provided to transmit signals coming from boards 40, 44 to the aircraft control panel.

The main function of the signal processing electronics 40, 44 is to process signals from the detector outputs to give the correct up/down and left/right commands to the servo system, which then points the ALT at the target.

As modified by the present invention, the signal processing electronics can be time shared between tracking and ranging functions, as desired.

The assembly of FIG. 1 is offered by way of example to explain the background of the present invention and the nature of the system in which it is used. The specific modifications made by the present invention to the assembly of FIG. 1 will be described in detail with reference to FIGS. 2, 3A, 3B, and 4.

Referring in detail to FIG. 2 there is illustrated an optical system of a type generally known in the receiver portion of the airborne laser tracker of FIG. 1. The optical system includes a transparent dome 10 through which incident radiation RI from the object being tracked is transmitted. Radiation RI passes through filter F into a collector lens C wherein it is reflected by a reflective coating CR on the rear face thereof. The reflected radiation RF by virtue of reflector CR is directed toward detector D through an immersion lens IL. The housing of detector D is glued directly to the glass of immersion lens IL. Detector D includes both quadrant detector QD and silicon avalanche detector SAD to be described more fully hereinafter.

Figure 3A:
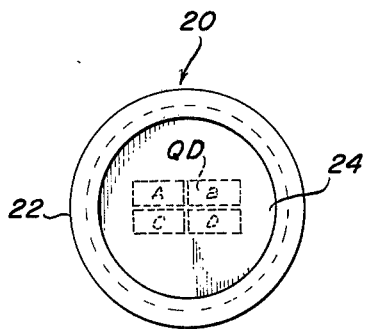
FIGS. 3A and 3B illustrate, respectively, top plan and side elevational views of the detector of FIG. 1 disposed in a case or housing.
Figure 3B:
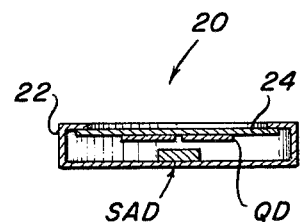

The housing of detector D generally indicated 20 is illustrated in FIGS. 3A and 3B. As illustrated the housing 20 includes a cylindrical case 22 opened at one end. A transparent window 24 is provided to cover the open end of case 22. Mounted directly behind window 24 is quadrant detector QD which includes four metalized electrodes A, B, C, D.

Electrodes A, B, C, D are equally spaced apart by approximately 0.005 inches. The silicon avalanche detector SAD of the present invention is disposed behind quadrant detector QD to receive radiation passing between the spaced electrodes, as will be more fully described hereinafter with reference to FIG. 4.

Figure 4:
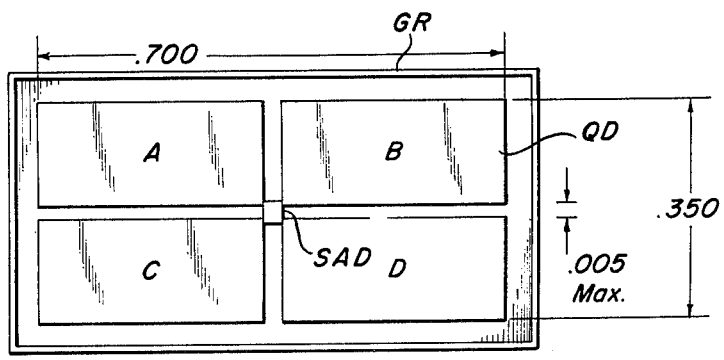
FIG. 4 is an enlarged diagrammatic view of the detector configuration of the present invention.

FIG. 4 is an enlarged view of quadrant detector QD illustrating the relative location of silicon avalanche detector SAD with respect thereto. As illustrated electrodes A, B, C, D are equally spaced by approximately 0.005 inches and SAD is disposed behind QD at the intersection of the respective spaces. An optional guard ring GR may be provided which surrounds detector QD.

In operation only a portion of radiation RF is absorbed by quadrant detector QD on the first pass. The remainder is either reflected back within detector housing 20 by metalized electrodes A, B, C, D or passes between the spacings of the respective quadrants. By placing detector SAD, as shown, a substantial increase in the amount of radiation detected occurs, thereby giving the airborne laser tracker a ranging capability. Detector SAD detects a substantial portion of radiation passing through the spaces between the quadrants which would otherwise be lost.

The amount of light passing through a quadrant detector QD having the dimensions shown in FIGS. 4 can be calculated from the following equations: (1) to (4)

1. $T_T = T_D \cdot T_C$, where $T_D$ is the transmission of the detector QD, $T_C$ is the transmission of QD during the change of index, and $T_T$ is the total radiation passing between the quadrant spaces.

2. $T_D = e^{(-\alpha D)}$, where $\alpha$ = the absorption coefficient of silicon at 1.06$\mu$ and room temperature and D = the thickness of the detector (0.02 inches) Thus calculating TD: $T_D = e^{(-12.5\ cm^{-1} \cdot 0.05\ cm)}$ $T_D$ 53%

3. $T_C = (1-R)$ where R = reflection due to change of refractive index.

4.

$$R = \left[\frac{N_s - N_c}{N_s + N_c}\right]^2$$

where Ns = the refractive index of silicon and Nc = the refractive index of air. Thus $$R = \left[\frac{3.5 - 1}{3.5 + 1}\right]^2, = 30\%$$

= 30% Thus Tc from equation (3) equals 70%. Returning to equation (1) and inserting appropriate values $T_T$ = 37%.

Accordingly, a substantial portion of radiation entering the detector D of the present invention passes thru the quadrant detector QD. It is this radiation that is utilized by the present invention to provide a ranging function from the airborne laser tracker.

In order for the ALT to function as a rangefinder signals from the output of detector SAD may be fed to the signal processing electronics normally used for tracking. These electronics may be timed shared to compute the range of a target which may be displayed on a suitable indicator on the control panel in the cockpit.

It should be understood that the apparatus described herein may be modified as would occur to one of ordinary skill in the art without departing from the spirit and scope of the present invention.

What is claimed is:

1. An airborne laser tracker with a target ranging capability including an optical system having an optical axis and receptive of laser radiation from a target comprising: a first detector means disposed adjacent said optical axis for detecting radiation received by said optical system, said first detector means including spaced electrodes upon which a portion of said received radiation impinges, another portion of said received radiation passing through spaces between said electrodes; and second detector means for target ranging mounted in fixed relation with respect to said first detector means, said second detector means disposed behind said first detector means along said optical axis in substantial alignment with said first detector means for intercepting said another portion of said radiation for detecting radiation transmitted between electrodes of said first detector means, said second detector means having a sensitivity greater than that of said first detector means and an aperture smaller than that of said first detector means.

2. The airborne laser tracker of claim 1 wherein said second detector comprises a silicon avalanche detector.

3. The airborne laser tracker of claim 1 wherein said first detection means is a quadrant detector having four spaced electrodes, the spaces between said electrodes defining a cruciform and said second detector means is axially disposed in alignment with the point of intersection of said cruciform.

4. The airborne laser tracker of claim 2 wherein said second detector means is a silicon avalanche detector the aperture of which is smaller than that of said first detector means.

5. The airborne laser tracker of claim 4 wherein said optical system comprises:

transparent dome means for enclosing said optical system and for transmitting radiation from said target;

filter means for selectively passing radiation of predetermined wavelengths;

collector lens means for receiving radiation passed by said filter;

reflector means for reflecting radiation exiting from said collector lens means back through said collector lens means; and immersion lens means in direct contact with said collector lens means for receiving said reflected radiation.

6. The airborne laser tracker of claim 1 wherein said both said detector means are encapsulated in a common housing.

7. The airborne laser tracker of claim 5 wherein said detectors are encapsulated in a common housing glued directly to said immersion lens.

* * * * *